United States Patent
Zhao et al.

(10) Patent No.: US 11,283,063 B1
(45) Date of Patent: Mar. 22, 2022

(54) POLARIZATION COMPENSATION IN SILICON-DOMINANT ELECTRODE CELLS

(71) Applicant: Enevate Corporation, Irvine, CA (US)

(72) Inventors: Hong Zhao, Aliso Viejo, CA (US); Benjamin Yong Park, Mission Viejo, CA (US)

(73) Assignee: ENEVATE CORPORATION, Irvine, CA (US)

( * ) Notice: Subject to any disclaimer, the term of this patent is extended or adjusted under 35 U.S.C. 154(b) by 0 days.

(21) Appl. No.: 17/198,821

(22) Filed: Mar. 11, 2021

(51) Int. Cl.
| | |
|---|---|
| *H01M 4/134* | (2010.01) |
| *H01M 10/44* | (2006.01) |
| *H01M 10/42* | (2006.01) |
| *H01M 4/38* | (2006.01) |
| *G01R 31/392* | (2019.01) |

(52) U.S. Cl.
CPC .......... *H01M 4/134* (2013.01); *G01R 31/392* (2019.01); *H01M 4/386* (2013.01); *H01M 10/425* (2013.01); *H01M 10/44* (2013.01); *H01M 2010/4271* (2013.01)

(58) Field of Classification Search
None
See application file for complete search history.

(56) References Cited

U.S. PATENT DOCUMENTS

2012/0056590 A1* 3/2012 Amiruddin ........... H01M 4/525
320/130

* cited by examiner

*Primary Examiner* — Daniel S Gatewood
(74) *Attorney, Agent, or Firm* — McAndrews, Held & Malloy, Ltd.

(57) ABSTRACT

Systems and methods are provided for polarization compensation in silicon-dominant electrode cells. One or more adjustments to operation of a silicon-dominant cell maybe applied based on effects of polarization in the silicon-dominant cell during charge/discharge cycles, with the one or more adjustments configured to compensate for at least some of the effects of polarization in the silicon-dominant cell.

18 Claims, 9 Drawing Sheets

POLARIZATION COMPENSATION IN SILICON-DOMINANT ELECTRODE CELLS

CROSS-REFERENCE TO RELATED APPLICATIONS/INCORPORATION BY REFERENCE

This patent application makes reference to U.S. patent application Ser. No. 17/192,877, filed Mar. 4, 2021. The above identified applications is hereby incorporated herein by reference in its entirety.

TECHNICAL FIELD

Aspects of the present disclosure relate to energy generation and storage. More specifically, certain implementations of the present disclosure relate to methods and systems for polarization compensation in silicon-dominant electrode cells.

BACKGROUND

Various issues may exist with conventional battery technologies. In this regard, conventional systems and methods for managing rechargeable batteries during multiple charging/discharging cycles may be costly, cumbersome, and/or inefficient—e.g., they may be complex and/or time consuming to implement, and may limit battery lifetime.

Further limitations and disadvantages of conventional and traditional approaches will become apparent to one of skill in the art, through comparison of such systems with some aspects of the present disclosure as set forth in the remainder of the present application with reference to the drawings.

BRIEF SUMMARY

System and methods are provided for polarization compensation in silicon-dominant electrode cells, substantially as shown in and/or described in connection with at least one of the figures, as set forth more completely in the claims.

These and other advantages, aspects and novel features of the present disclosure, as well as details of an illustrated embodiment thereof, will be more fully understood from the following description and drawings.

DETAILED DESCRIPTION

Figure 1A:
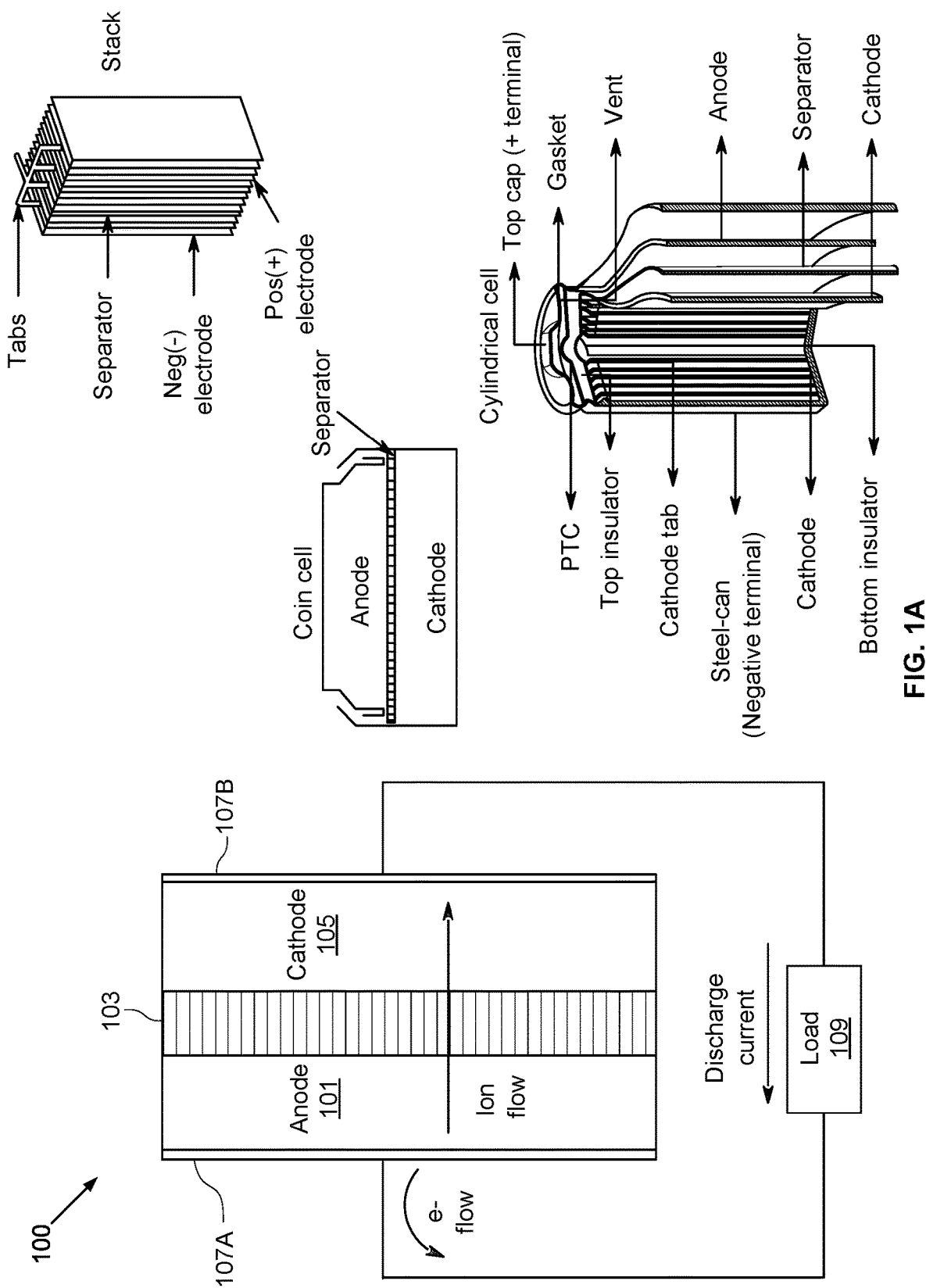
FIG. 1A is a diagram of an example battery, in accordance with the present disclosure.

FIG. 1A is a diagram of an example battery, in accordance with the present disclosure. Referring to FIG. 1A, there is shown a battery 100 comprising a separator 103 sandwiched between an anode 101 and a cathode 105, with current collectors 107A and 107B. There is also shown a load 109 coupled to the battery 100 illustrating instances when the battery 100 is in discharge mode. In this disclosure, the term "battery" may be used to indicate a single electrochemical cell, a plurality of electrochemical cells formed into a module, and/or a plurality of modules formed into a pack. Furthermore, the battery 100 shown in FIG. 1A is a very simplified example merely to show the principle of operation of a lithium ion cell. Examples of realistic structures are shown to the right in FIG. 1A, where stacks of electrodes and separators are utilized, with electrode coatings typically on both sides of the current collectors. The stacks may be formed into different shapes, such as a coin cell, cylindrical cell, or prismatic cell, for example.

The development of portable electronic devices and electrification of transportation drive the need for high performance electrochemical energy storage. Small-scale (<100 Wh) to large-scale (>10 KWh) devices primarily use lithium-ion (Li-ion) batteries over other rechargeable battery chemistries due to their high-performance.

The anode 101 and cathode 105, along with the current collectors 107A and 107B, may comprise the electrodes, which may comprise plates or films within, or containing, an electrolyte material, where the plates may provide a physical barrier for containing the electrolyte as well as a conductive contact to external structures. In other embodiments, the anode/cathode plates are immersed in electrolyte while an outer casing provides electrolyte containment. The anode 101 and cathode 105 are electrically coupled to the current collectors 107A and 107B, which comprise metal or other conductive material for providing electrical contact to the electrodes as well as physical support for the active material in forming electrodes.

The configuration shown in FIG. 1A illustrates the battery 100 in discharge mode, whereas in a charging configuration, the load 109 may be replaced with a charger to reverse the process. In one class of batteries, the separator 103 is generally a film material, made of an electrically insulating polymer, for example, that prevents electrons from flowing from anode 101 to cathode 105, or vice versa, while being porous enough to allow ions to pass through the separator 103. Typically, the separator 103, cathode 105, and anode 101 materials are individually formed into sheets, films, or active material coated foils. In this regard, different methods or processes may be used in forming electrodes, particularly silicon-dominant anodes. For example, lamination or direct coating may be used in forming a silicon anode. Examples of such processes are illustrated in and described with respect to FIGS. 2 and 3. Sheets of the cathode, separator and anode are subsequently stacked or rolled with the separator 103 separating the cathode 105 and anode 101 to form the battery 100. In some embodiments, the separator 103 is a sheet and generally utilizes winding methods and stacking in its manufacture. In these methods, the anodes, cathodes, and current collectors (e.g., electrodes) may comprise films.

In an example scenario, the battery 100 may comprise a solid, liquid, or gel electrolyte. The separator 103 preferably does not dissolve in typical battery electrolytes such as compositions that may comprise: Ethylene Carbonate (EC), Fluoroethylene Carbonate (FEC), Propylene Carbonate (PC), Dimethyl Carbonate (DMC), Ethyl Methyl Carbonate (EMC), Diethyl Carbonate (DEC), etc. with dissolved $LiBF_4$, $LiAsF_6$, $LiPF_6$, and $LiClO_4$ etc. In an example scenario, the electrolyte may comprise Lithium hexafluorophosphate ($LiPF_6$) and lithium bis(trifluoromethanesulfonyl)imide (LiTFSI) that may be used together in a variety of electrolyte solvents. Lithium hexafluorophosphate ($LiPF_6$) may be present at a concentration of about 0.1 to 2.0 molar (M) and lithium bis(trifluoromethanesulfonyl)imide (LiTFSI) may be present at a concentration of about 0 to 2.0 molar (M). Solvents may comprise one or more of ethylene carbonate (EC), fluoroethylene carbonate (FEC) and/or ethyl methyl carbonate (EMC) in various percentages. In some embodiments, the electrolyte solvents may comprise one or more of EC from about 0-40%, FEC from about 2-40% and/or EMC from about 50-70% by weight.

The separator 103 may be wet or soaked with a liquid or gel electrolyte. In addition, in an example embodiment, the separator 103 does not melt below about 100 to 120° C., and exhibits sufficient mechanical properties for battery applications. A battery, in operation, can experience expansion and contraction of the anode and/or the cathode. In an example embodiment, the separator 103 can expand and contract by at least about 5 to 10% without failing, and may also be flexible.

The separator 103 may be sufficiently porous so that ions can pass through the separator once wet with, for example, a liquid or gel electrolyte. Alternatively (or additionally), the separator may absorb the electrolyte through a gelling or other process even without significant porosity. The porosity of the separator 103 is also generally not too porous to allow the anode 101 and cathode 105 to transfer electrons through the separator 103.

The anode 101 and cathode 105 comprise electrodes for the battery 100, providing electrical connections to the device for transfer of electrical charge in charge and discharge states. The anode 101 may comprise silicon, carbon, or combinations of these materials, for example. Typical anode electrodes comprise a carbon material that includes a current collector such as a copper sheet. Carbon is often used because it has excellent electrochemical properties and is also electrically conductive. Anode electrodes currently used in rechargeable lithium-ion cells typically have a specific capacity of approximately 200 milliamp hours per gram. Graphite, the active material used in most lithium ion battery anodes, has a theoretical energy density of 372 milliamp hours per gram (mAh/g). In comparison, silicon has a high theoretical capacity of 4200 mAh/g. In order to increase volumetric and gravimetric energy density of lithium-ion batteries, silicon may be used as the active material for the cathode or anode. Silicon anodes may be formed from silicon composites, with more than 50% silicon or more by weight in the anode material on the current collector, for example.

In an example scenario, the anode 101 and cathode 105 store the ion used for separation of charge, such as lithium. In this example, the electrolyte carries positively charged lithium ions from the anode 101 to the cathode 105 in discharge mode, as shown in FIG. 1A for example, and vice versa through the separator 105 in charge mode. The movement of the lithium ions creates free electrons in the anode 101 which creates a charge at the positive current collector 107B. The electrical current then flows from the current collector through the load 109 to the negative current collector 107A. The separator 103 blocks the flow of electrons inside the battery 100, allows the flow of lithium ions, and prevents direct contact between the electrodes.

While the battery 100 is discharging and providing an electric current, the anode 101 releases lithium ions to the cathode 105 via the separator 103, generating a flow of electrons from one side to the other via the coupled load 109. When the battery is being charged, the opposite happens where lithium ions are released by the cathode 105 and received by the anode 101.

The materials selected for the anode 101 and cathode 105 are important for the reliability and energy density possible for the battery 100. The energy, power, cost, and safety of current Li-ion batteries need to be improved in order to, for example, compete with internal combustion engine (ICE) technology and allow for the widespread adoption of electric vehicles (EVs). High energy density, high power density, and improved safety of lithium-ion batteries are achieved with the development of high-capacity and high-voltage cathodes, high-capacity anodes and functionally non-flammable electrolytes with high voltage stability and interfacial compatibility with electrodes. In addition, materials with low toxicity are beneficial as battery materials to reduce process cost and promote consumer safety.

The performance of electrochemical electrodes, while dependent on many factors, is largely dependent on the robustness of electrical contact between electrode particles, as well as between the current collector and the electrode particles. The electrical conductivity of silicon anode electrodes may be manipulated by incorporating conductive additives with different morphological properties. Carbon black (SuperP), vapor grown carbon fibers (VGCF), and a mixture of the two have previously been incorporated separately into the anode electrode resulting in improved performance of the anode. The synergistic interactions between the two carbon materials may facilitate electrical contact throughout the large volume changes of the silicon anode during charge and discharge.

State-of-the-art lithium-ion batteries typically employ a graphite-dominant anode as an intercalation material for lithium. Silicon-dominant anodes, however, offer improvements compared to graphite-dominant Li-ion batteries. Silicon exhibits both higher gravimetric (3579 mAh/g vs. 372 mAh/g for graphite) and volumetric capacities (2194 mAh/L vs. 890 mAh/L for graphite). In addition, silicon-based anodes have a low lithiation/delithiation voltage plateau at about 0.3-0.4V vs. Li/Li+, which allows it to maintain an open circuit potential that avoids undesirable Li plating and dendrite formation. While silicon shows excellent electrochemical activity, achieving a stable cycle life for silicon-based anodes is challenging due to silicon's large volume changes during lithiation and delithiation. Silicon regions may lose electrical contact from the anode as large volume changes coupled with its low electrical conductivity separate the silicon from surrounding materials in the anode.

In addition, the large silicon volume changes exacerbate solid electrolyte interphase (SEI) formation, which can further lead to electrical isolation and, thus, capacity loss. Expansion and shrinkage of silicon particles upon charge-discharge cycling causes pulverization of silicon particles, which increases their specific surface area. As the silicon surface area changes and increases during cycling, SEI repeatedly breaks apart and reforms. The SEI thus continually builds up around the pulverizing silicon regions during cycling into a thick electronic and ionic insulating layer. This accumulating SEI increases the impedance of the electrode and reduces the electrode electrochemical reactivity, which is detrimental to cycle life.

A solution to enhance the electrical conductivity of Li-ion battery anodes and cathodes is to introduce conductive structural additives to the anode active material layer. The additives may comprise materials that are stronger than the binder materials, able to withstand the expansion and contraction caused by the lithiation of the silicon, providing a structural and electrical connection between cracked regions of the active material layer. The materials may comprise long filaments (1D), such as carbon nanotubes, for example, planar sheets (2D), such as graphene, or chunks of material (3D). Two primary benefits of adding conductive additives to anodes and cathodes are improved particle-to-particle conductivity and improved particle-to-current-collector conductivity. These additives maintain conductive pathways for electrons, minimizing capacity loss in electrode active materials and, thus, enhancing the overall performance of Li-ion batteries.

In accordance with the present disclosure, measures may be used to enhance and optimize performance of silicon-dominant batteries, particularly to account for and/or counteract the effects of polarization. In this regard, in many cases, the actual available lithium (or energy stored therein) may reduce at a slower rate than the increase in polarization. During cycling, cell polarization increase affects the actual charge/discharge depth. When cells are charged/discharged to certain voltage where anode/cathode has large amount of capacity, the polarization increase may cause apparent capacity fade whereas the real capacity fade is much smaller. Thus, when running a current in the cell, voltage drop may be significant, which may have some effects on the cells and/or performance thereof—e.g., causing cutoff sooner than it should.

Accordingly, in various implementations in accordance with the present disclosure, measures that account for and/or counteract the polarization and effects thereof may be used, resulting in improved and/or optimized performance of the cells. For example, use of adaptive compensation for polarization may result in improved and/or optimized performance. In this regard, polarization may be compensated for by, for example, cutting off operation of the cells at different voltages, as polarization causes a voltage difference over time—e.g., because a diffusion layer creates a polarization boundary, which may result in variations to cutoff points. In particular, compensation may comprise allowing the cell to go to lower voltage (below discharge cutoff voltage) at discharge, and/or to go to higher voltage (above cutoff charging voltage) at charging.

In some instances, polarization-based compensation measures, as described herein, may be used in conjunction with other performance enhancing measures. For example, in some implementations voltage adjustments for polarization-based compensation may be used in conjunction with voltage parameters adjustments during cycling, such as using key predictors and machine learning, as described in more detail in incorporated U.S. patent application Ser. No. 17/192,877.

Optimizing use of polarization-based measures may require accurate determination of polarization (and parameters relating thereto), such as during cycling. In this regard, inaccurate polarization determination may result in undesired effects—e.g., causing capacity increase after compensation. Accordingly, the polarization is determined by using the difference between normal and slow rate discharge. In some implementations, various techniques and/or approaches may be used to determine compensation related parameters or criteria—e.g., point at which cutoff actually occurs, amount of cutoff change/adjustment in cutoff. For example, state of health may be used to determine the cutoff point, which may continue to change. In an example implementation, a self-assessment may be performed when the cell is not being used. In another implementation, pulse test on the cell may be used to estimate polarization, and the cutoff may then be adjusted based on the determined polarization. Further, in some instances overpotential may be used.

In various implementations, solutions for compensating for polarization as described in the present disclosure may be used in systems or products incorporating cells/batteries, such as cell packs, batter management systems (BMS), vehicles, etc. to extend the useful lifetime of these systems or products, particularly by increasing the number of charge/discharge cycles possible using these cells/batteries.

Figure 1B:
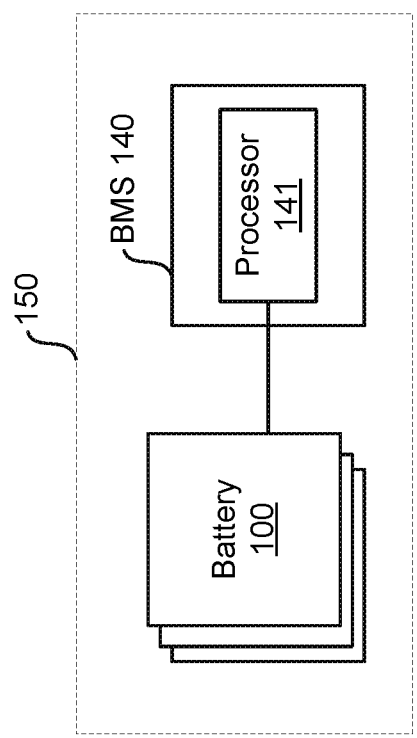
FIG. 1B illustrate an example battery management system (BMS) for use in managing operation of batteries, in accordance with the present disclosure.

FIG. 1B illustrate an example battery management system (BMS) for use in managing operation of batteries, in accordance with the present disclosure. Shown in FIG. 1B is battery management system (BMS) 140.

The battery management system (BMS) 140 may comprise suitable circuitry (e.g., processor 141) configured to manage one or more batteries (e.g., each being an instance of the battery 100 as described with respect with FIG. 1A). In this regard, the BMS 140 may be in communication and/or coupled with each battery 100.

In some embodiments, the battery 100 and the BMS 140 can be in communication and/or coupled with each other, for example, via electronics or wireless communication. In some embodiments, the BMS 140 may be incorporated into the battery 100. Alternatively, in some embodiments, the BMS 140 and the battery 100 may be combined into a common package 150. Further, in some embodiments, the BMS 140 and the battery 100 may be separate devices/components, and may only be in communication with one another when present in the same system. The disclosure is not limited to any particular arrangement, however.

In accordance with the present disclosure, the BMS 140 may be configured for supporting managing polarization related compensation. In this regard, the BMS 140 (e.g., via the processor 141 thereof) may be configured to detect polarization, determination polarization related parameters, implemented polarization-related adjustments (e.g., compensation), determine various parameters relating to the adjustments, etc., as described in this disclosure—e.g., with respect to FIGS. 1A and 4-8. For example, in an example use scenario, the BMS 140 may determine polarization related parameters, and may adjusted based on these parameters cutoff voltage applied during discharge of the battery (e.g., from 3.0V to 2.9V).

Figure 2:
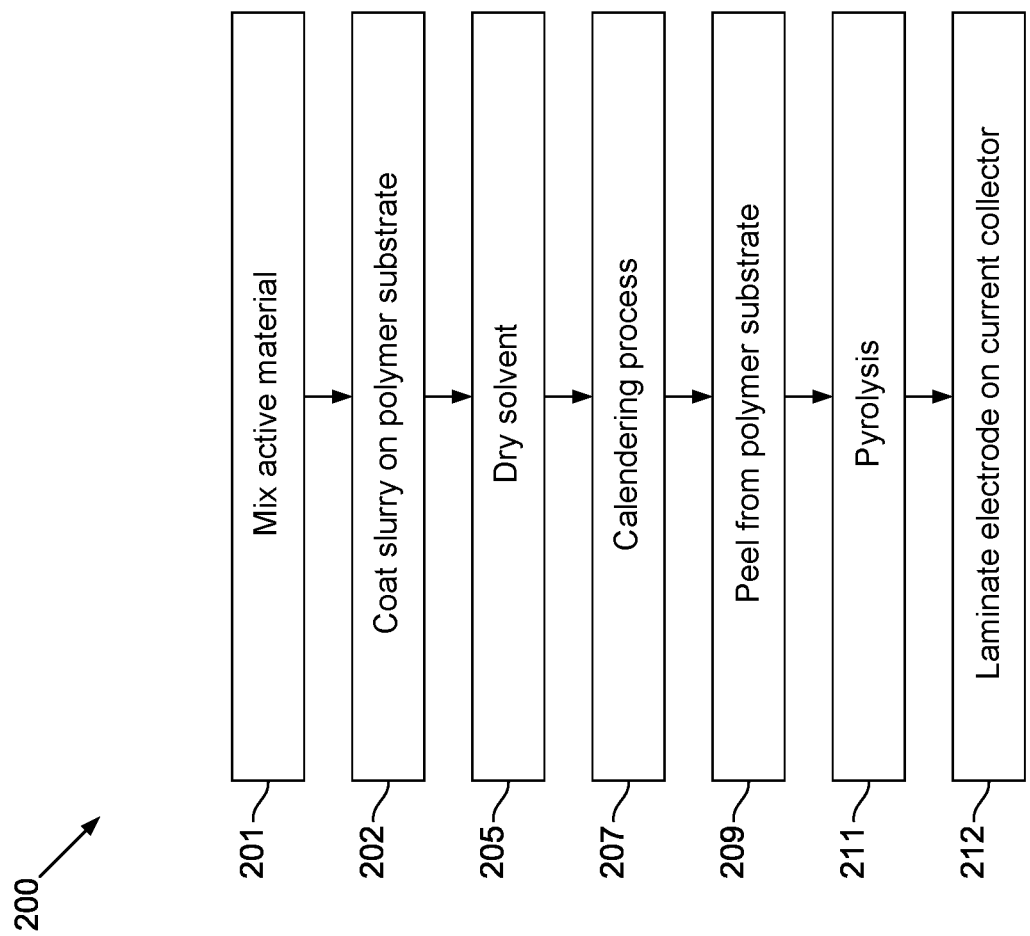
FIG. 2 is a flow diagram of an example lamination process for forming a silicon anode, in accordance with the present disclosure.

FIG. 2 is a flow diagram of an example lamination process for forming a silicon anode, in accordance with the present disclosure. Shown in FIG. 2 is flow chart 200, comprising a plurality of example steps (represented as blocks 201-213) for an example lamination process. In this regard, this process employs a high-temperature pyrolysis process on a substrate, layer removal, and a lamination process to adhere the active material layer to a current collector.

The raw electrode active material is mixed in step 201. In the mixing process, the active material may be mixed, e.g., a binder/resin (such as PI, PAI), solvent, and conductive additives. The materials may comprise carbon nanotubes/ fibers, graphene sheets, metal polymers, metals, semiconductors, and/or metal oxides, for example. The additives may comprise 1D filaments with one dimension at least 4×, at least 10×, or at least 20× that of the other two dimensions, 2D sheets or mesh with two dimensions at least 4×, at least 10×, or at least 20× that of the other dimension, or 3D structures with one dimension at least 20×, at least 10×, or at least 4× that of the other two, where none of the dimensions are of nanoscale size. Silicon powder with a 1-30 or 5-30 µm particle size, for example, may then be dispersed in polyamic acid resin (15% solids in N-Methyl pyrrolidone (NMP)) at, e.g., 1000 rpm for, e.g., 10 minutes, and then the conjugated carbon/NMP slurry may be added and dispersed at, e.g., 2000 rpm for, e.g., 10 minutes to achieve a slurry viscosity within 2000-4000 cP and a total solid content of about 30%.

In step 203, the slurry may be coated on a substrate. In this step, the slurry may be coated onto a Polyester, polyethylene terephthalate (PET), or Mylar film at a loading of, e.g., 2-4 mg/cm$^2$ and then in step 205 undergo drying to an anode coupon with high Si content and less than 15% residual solvent content. This may be followed by an optional calendering process in step 207, where a series of hard pressure rollers may be used to finish the film/substrate into a smoothed and denser sheet of material.

In step 209, the green film may then be removed from the PET, where the active material may be peeled off the polymer substrate, the peeling process being optional for a polypropylene (PP) substrate, since PP can leave ~2% char residue upon pyrolysis. The peeling may be followed by a pyrolysis step 211 where the material may be heated to >900° C. but less than 1250° C. for 1-3 hours, cut into sheets, and vacuum dried using a two-stage process (120° C. for 15 h, 220° C. for 5 h). The dry film may be thermally treated at, e.g., 1100-1200° C. to convert the polymer matrix into carbon.

In step 213, the electrode material may be laminated on a current collector. For example, a 5-20 µm thick copper foil may be coated with polyamide-imide with a nominal loading of, e.g., 0.2-0.6 mg/cm$^2$ (applied as a 6 wt % varnish in NMP and dried for, e.g., 12-18 hours at, e.g., 110° C. under vacuum). The anode coupon may then be laminated on this adhesive-coated current collector. In an example scenario, the silicon-carbon composite film is laminated to the coated copper using a heated hydraulic press. An example lamination press process comprises 30-70 seconds at 300° C. and 3000-5000 psi, thereby forming the finished silicon-composite electrode.

The process described above is one example process that represents a composite with fabrication steps including pyrolysis and lamination. Another example scenario comprises a direct coating process in which an anode slurry is directly coated on a copper foil using a binder such as CMC, SBR, Sodium Alginate, PAI, PI and mixtures and combinations thereof. The process in this example comprises: direct coat active material on a current collector, dry, calendering, heat treatment.

In a direct coating process, an anode slurry is coated on a current collector with residual solvent followed by a calendaring process for densification followed by pyrolysis (~500-800° C.) such that carbon precursors are partially or completely converted into glassy carbon. Pyrolysis can be done either in roll form or after punching. If done in roll form, the punching is done after the pyrolysis process.

In another example of a direct coating process, an anode slurry may be coated on a current collector with low residual solvent followed by a calendaring process for densification followed by removal of residual solvent.

In an example scenario, the conductive structural additives, such as might be added in step 201 or 221 may comprise between 1 and 40% by weight of the anode composition, with between 50% and 99% silicon by weight. The fibrous (1D) particles may have an aspect ratio of at least 4, but may be higher than 10, higher than 20, or higher than 40, for example, and may comprise a tubular or fiber-like conductive structure with nanoscale size in two-dimensions, where carbon-based examples comprise carbon nanotubes, carbon nanofibers (CNF), and vapor grown carbon fibers (VGCP). Other fibrous structures are possible, such as metals, metal polymers, metal oxides The 2D carbon structures may have an average dimension in the micron scale in each of the two non-nanoscale dimensions that is at least 4× that in the thickness direction, for example, and may be at least 20× larger, or at least 40× larger in the lateral directions as compared to the thickness direction. Graphene sheets are an example of conductive carbon additives, while other 2D structures are possible, such as "wire" meshes of metal or metal polymers, for example.

Furthermore, the active material may comprise 3D conductive structural additives, where the material is not limited to nanoscale in any one dimension. In a 3D additive example, one dimension of the structure may be at least 4×, at least 10×, or at least 20× that of the other two dimensions, where none of the dimensions are of nanoscale size. Examples of 3D conductive structural additives may be "chunks" of carbon, metal, metal polymer, or semiconductors.

In another example scenario, the anode active material layer fabricated with the carbon additive described above may comprise 20 to 95% silicon and in yet another example scenario may comprise 50 to 95% silicon by weight.

Figure 3:
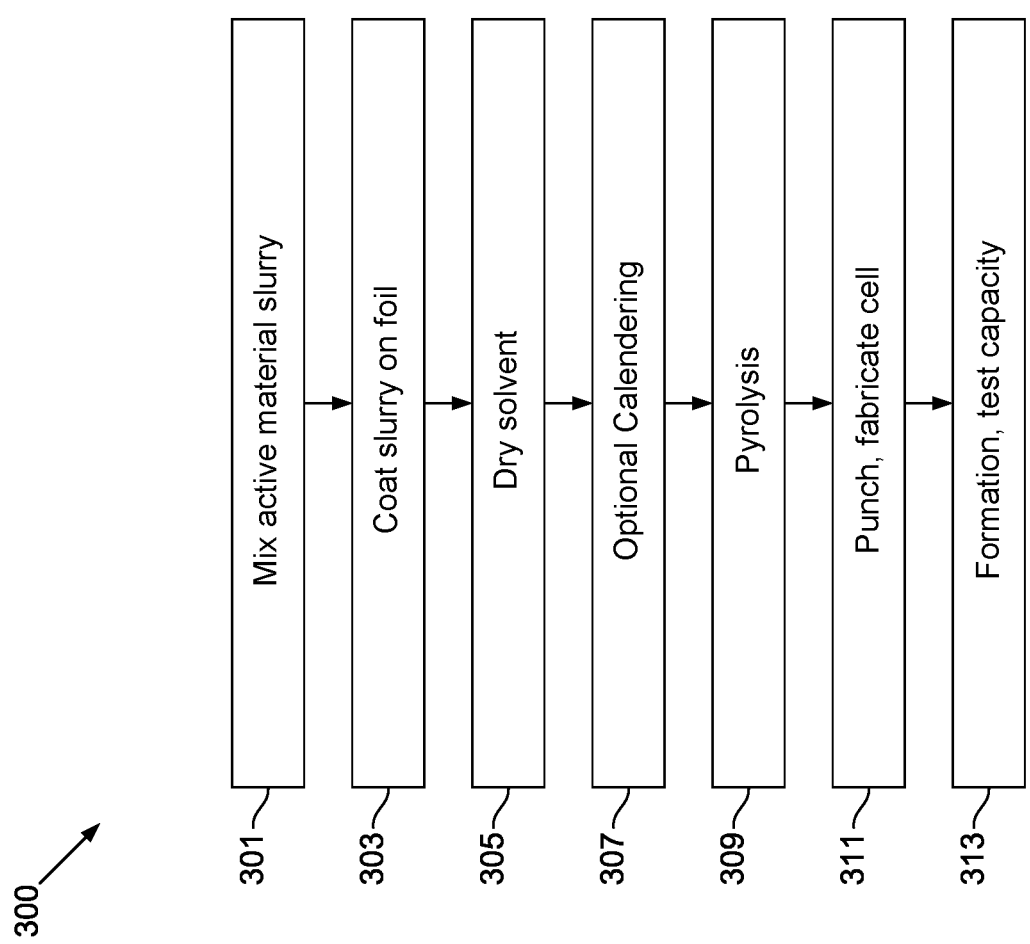
FIG. 3 is a flow diagram of an example direct coating process for forming a silicon anode, in accordance with the present disclosure.

FIG. 3 is a flow diagram of an example direct coating process for forming a silicon anode, in accordance with the present disclosure. Shown in FIG. 3 is flow chart 300, comprising a plurality of example steps (represented as blocks 301-313) for an example direct coating process. In this regard, this process comprises physically mixing the active material, conductive additive, and binder together, and coating it directly on a current collector. This example process comprises a direct coating process in which an anode or cathode slurry is directly coated on a copper foil using a binder such as CMC, SBR, Sodium Alginate, PAI, PI and mixtures and combinations thereof.

In step 301, the active material may be mixed, e.g., a binder/resin (such as PI, PAI), solvent, and conductive and structural additive. For example, the additives may comprise conductive materials that also provide structural continuity between cracks in the anode following multiple cycles. The materials may comprise carbon nanotubes/fibers, graphene sheets, metal polymers, metals, semiconductors, and/or metal oxides, metal/carbon nanofiber or metal/carbon nanotube composites, carbon nanowire bundles, for example. Silicon powder with a 5-30 µm particle size, for example, may then be dispersed in polyamic acid resin (15% solids in N-Methyl pyrrolidone (NMP)) at, e.g., 1000 rpm for, e.g., 10 minutes, and then the conjugated carbon/NMP slurry may be added and dispersed at, e.g., 2000 rpm for, e.g., 10 minutes to achieve a slurry viscosity within 2000-4000 cP and a total solid content of about 30%.

Furthermore, cathode active materials may be mixed in step 301, where the active material may comprise lithium cobalt oxide (LCO), lithium iron phosphate, lithium nickel cobalt manganese oxide (NMC), lithium nickel cobalt aluminum oxide (NCA), lithium manganese oxide (LMO), lithium nickel manganese spinel, or similar materials or combinations thereof, mixed with a binder as described above for the anode active material.

In step 303, the slurry may be coated on a copper foil. Similarly, cathode active materials may be coated on a foil material, such as aluminum, for example. The active material layer may undergo a drying in step 305 resulting in reduced residual solvent content. An optional calendering process may be utilized in step 307 where a series of hard pressure rollers may be used to finish the film/substrate into a smoother and denser sheet of material. In step 307, the foil and coating proceeds through a roll press for lamination.

In step 309, the active material may be pyrolyzed by heating to 500-1000° C. such that carbon precursors are partially or completely converted into glassy carbon. The pyrolysis step may result in an anode active material having silicon content greater than or equal to 50% by weight, where the anode has been subjected to heating at or above 400° C.

Pyrolysis can be done either in roll form or after punching in step 311. If done in roll form, the punching is done after the pyrolysis process. In instances where the current collector foil is not pre-punched/pre-perforated, the formed electrode may be perforated with a punching roller, for example. The punched electrodes may then be sandwiched with a separator and electrolyte to form a cell.

In step 313, the cell may be subjected to a formation process, comprising initial charge and discharge steps to lithiate the anode, with some residual lithium remaining, and the cell capacity may be assessed.

Figure 4:
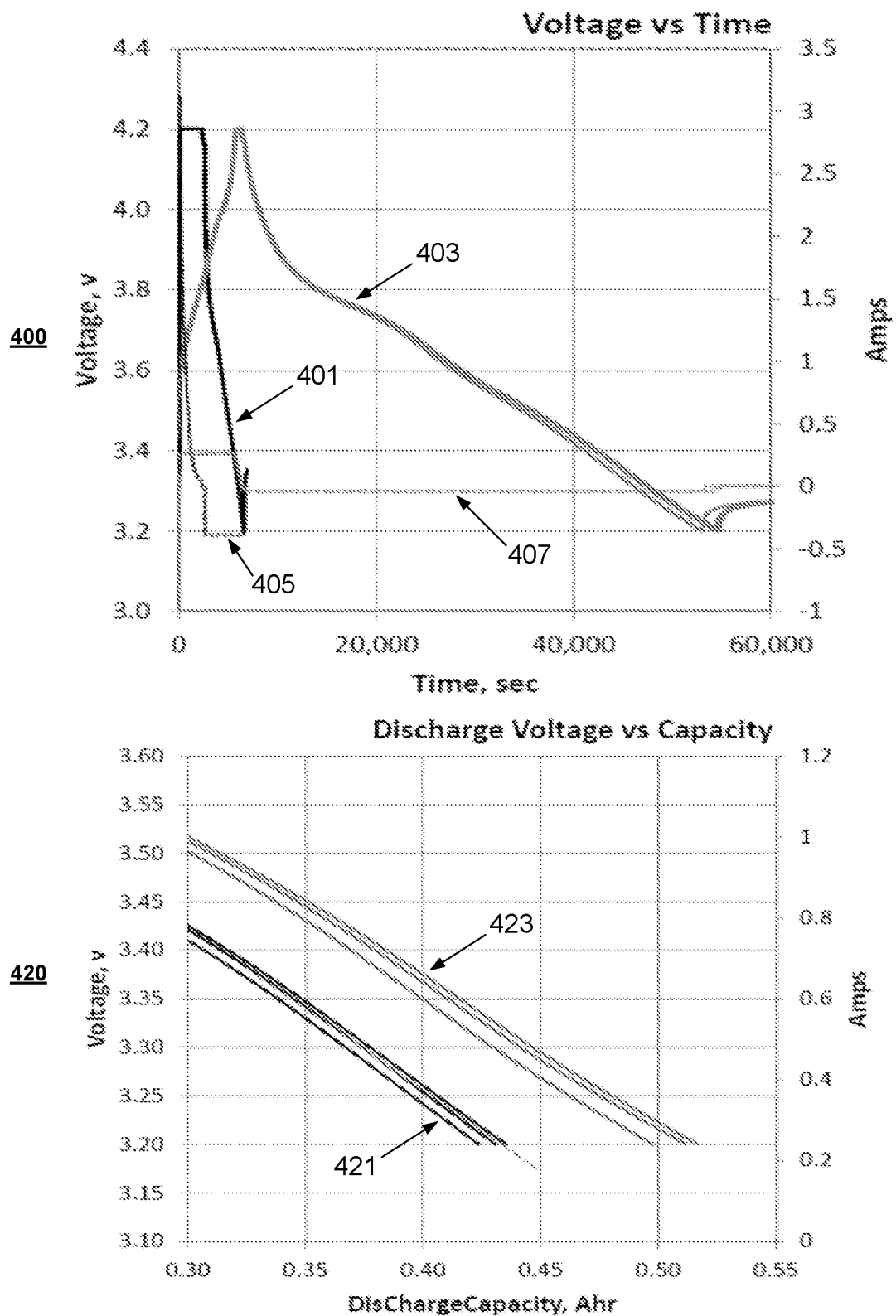
FIG. 4 illustrates polarization and voltage determination, in accordance with the present disclosure.

FIG. 4 illustrates polarization and voltage determination, in accordance with the present disclosure. Shown in FIG. 4 are charts 400 and 420, which illustrate voltage and current during charge and discharge for a cell which are used in polarization determination.

In this regard, charts 400 and 420 illustrate voltage and current during charge and discharge for a group of cells during normal cycling—that is, within the cell lifecycle (e.g., 450 cycles) and then during a subsequent cycle (e.g., cycle 451). In this regard, normal cycling may be comprise 4 C charge until C/20, 0.5 C discharge. True capacity check at every 50 cycles, with C/3 charge until C/20, and C/20 discharge (same voltage window as normal cycling). Illustrated in charts 400 and 420 are voltage plot 401 for normal cycling, voltage plot 403 for cycle 451, current plot 405 for normal cycling, current plot 407 for cycle 451, voltage plot 421 for discharge during normal cycling, and voltage plot 423 for discharge during cycle 451.

Assuming polarization is negligible at C/20, and capacity fade between adjacent cycles is negligible, polarization may be determined based on capacity difference between cycles. For example, the capacity difference between true capacity cycle and previous normal cycle may correspond to the polarization induced capacity. Accordingly, voltage adjustments, which may be applied to compensate for polarization, may be extrapolated from voltage curve(s) to match the capacity fade caused by polarization.

Figure 5:
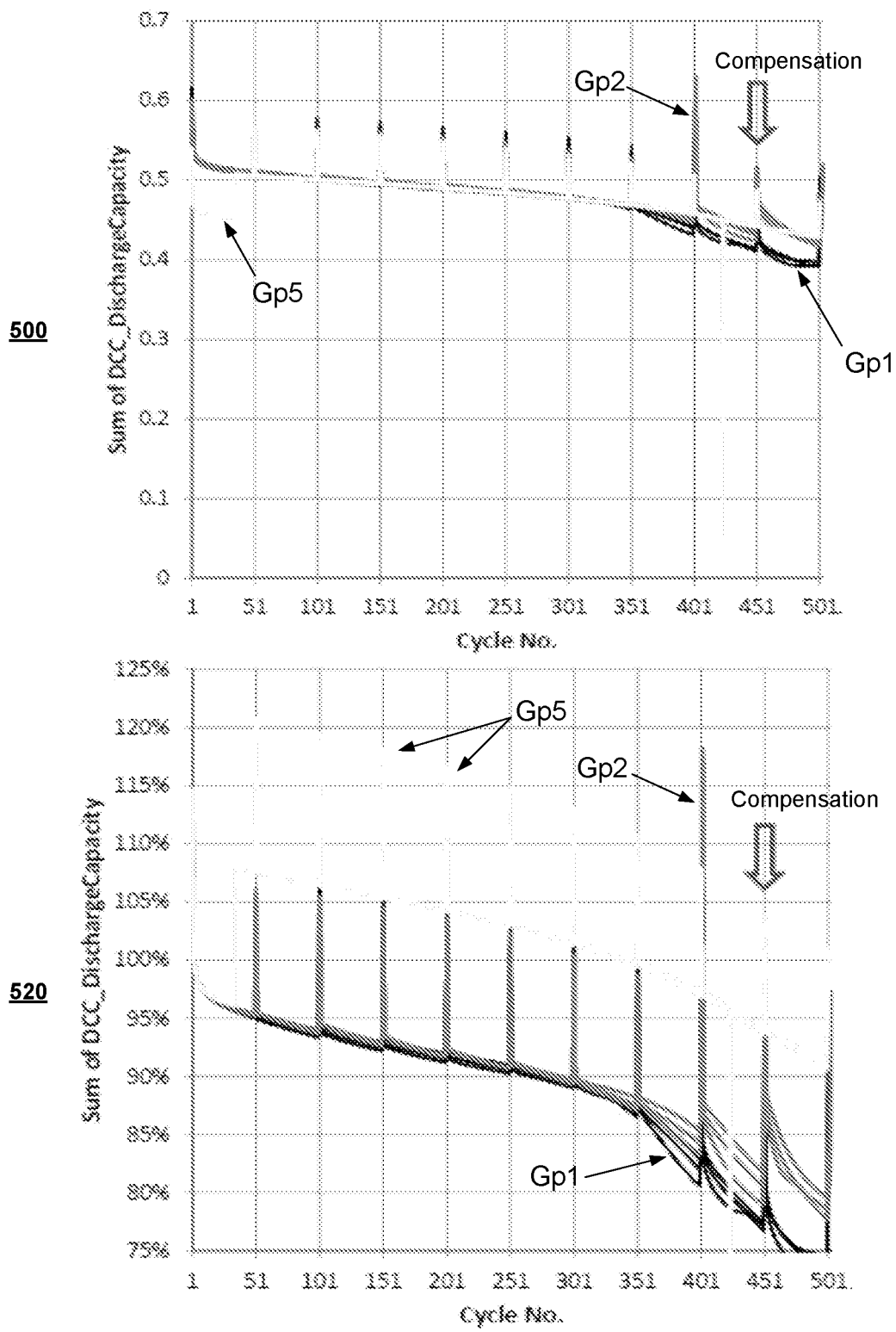
FIG. 5 illustrates discharge capacity characteristics for different groups of cells with 4.2V to 3.2V cycle life, including one group with compensation and one group with tapering.

FIG. 5 illustrates discharge capacity characteristics for different groups of cells with 4.2V to 3.2V cycle life, including one group with compensation and one group with tapering. Shown in FIG. 5 are charts 500 and 520, which illustrate discharge capacity profiles for three different groups of cells: Group 1, Group 2, and Group 5.

In this regard, these groups comprise similar cells but are tested under different test conditions. In particular, the discharge capacity for each of these groups is measured under 4 C charge to 4.2V and 0.5 C discharge to 3.2V—that is, 4 C (4.2V)/0.5 C cycles. However, while testing of Group 1 is limited to use of 4.2V to 3.2V cycles, for Group 2, while 4.2V to 3.2V cycles are used initially, after 451 cycles the cycle is adjusted to 4.2V to 3.17V. In other words, compensation is applied to Group 2 at cycle 451 by lowering the cutoff discharge voltage from 3.2V to 3.17V. For Group 5, 4.2V to 3.27V cycles are used, with C/20 taper after the initial 40 cycles—that is, 4.2V to 3.2V with taper every 50 cycles. As illustrated in charts 500 and 520 of FIG. 5, after the compensation is applied, capacity of Group 2 increases with similar fading slope as Group 1, but with cycle life extended by ~80 cycles.

Figure 6:
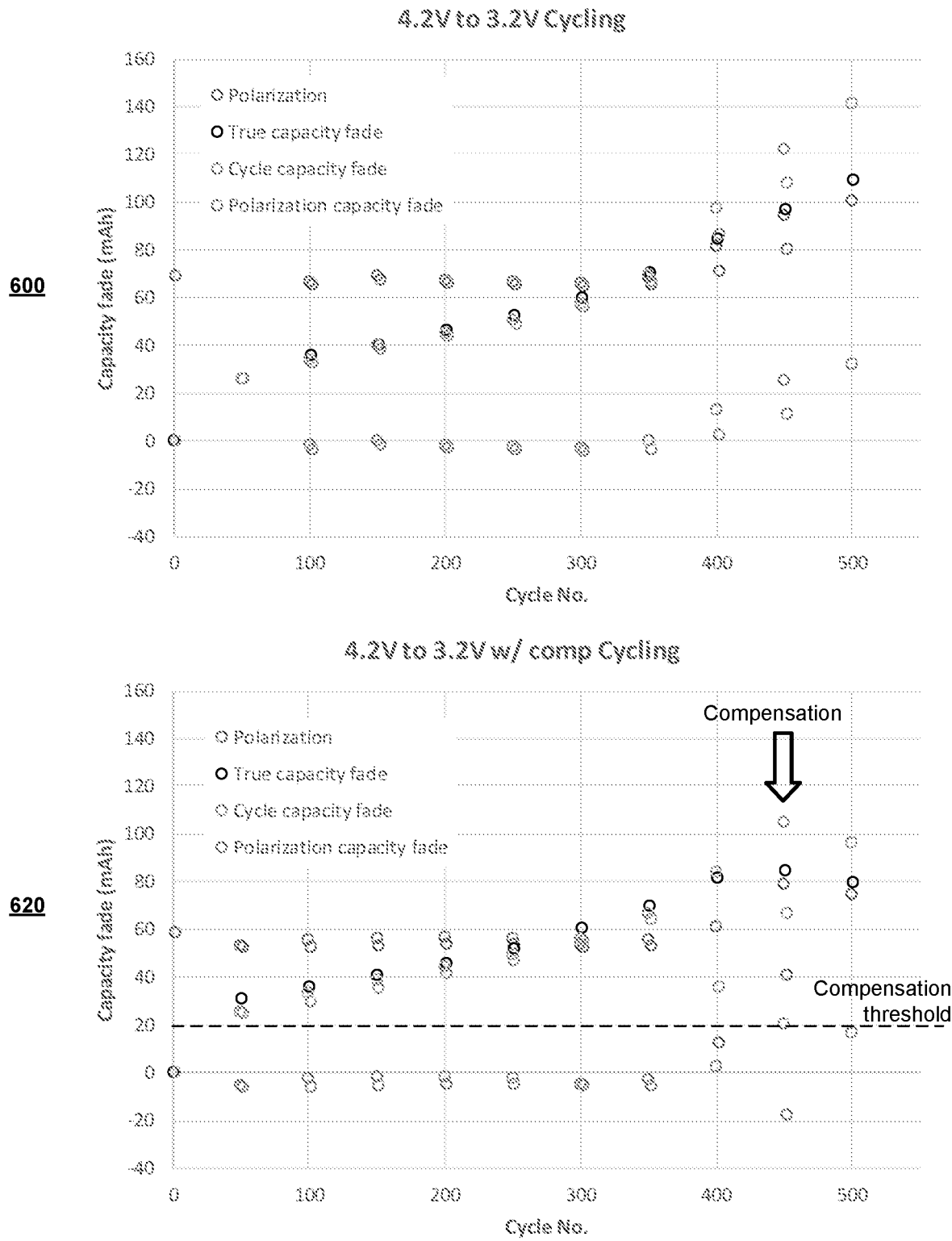
FIG. 6 illustrates capacity fade characteristics for example cells with 4.2V to 3.2V cycle life with and without compensation.

FIG. 6 illustrates capacity fade characteristics for example cells with 4.2V to 3.2V cycle life with and without compensation. Shown in FIG. 6 are charts 600 and 620, which illustrate capacity fade profile for cells used or tested under 4.2V to 3.2V cycle based conditions.

In particular, chart 600 shows capacity fade related parameters for cells used or tested under 4.2V to 3.2V cycle based conditions without any compensation, whereas chart 620 shows capacity fade related parameters for the same cells and the same cycle with compensation. In this regard, the capacity fade related parameters illustrated in FIG. 6 comprise true capacity fade, cycle capacity fade, polarization, and polarization capacity fade. Specifically, as shown in charts 600 and 620, true capacity fade=cycle 1 capacity–cycle X capacity (where x=51, 101, 151, etc.); cycle capacity fade=cycle 2 capacity–cycle X capacity (x excluding 51, 101, 151 etc.); polarization=true capacity–cycle capacity (±1 cycle); and polarization capacity fade=cycle capacity fade–true capacity fade.

As illustrated in charts 600 and 620, without polarization capacity fade, the true capacity fade may match cycle capacity fade. The difference is caused by polarization capacity fade. Initially polarization capacity fade may be negative, which means it is hiding part of the true capacity fade. Over time polarization capacity fade gradually grows larger. However, when compensation is applied, such as when polarization capacity fade exceeds a particular compensation threshold (which may be pre-determined and/or pre-set), polarization capacity fade is reduced after compensation.

Figure 7:
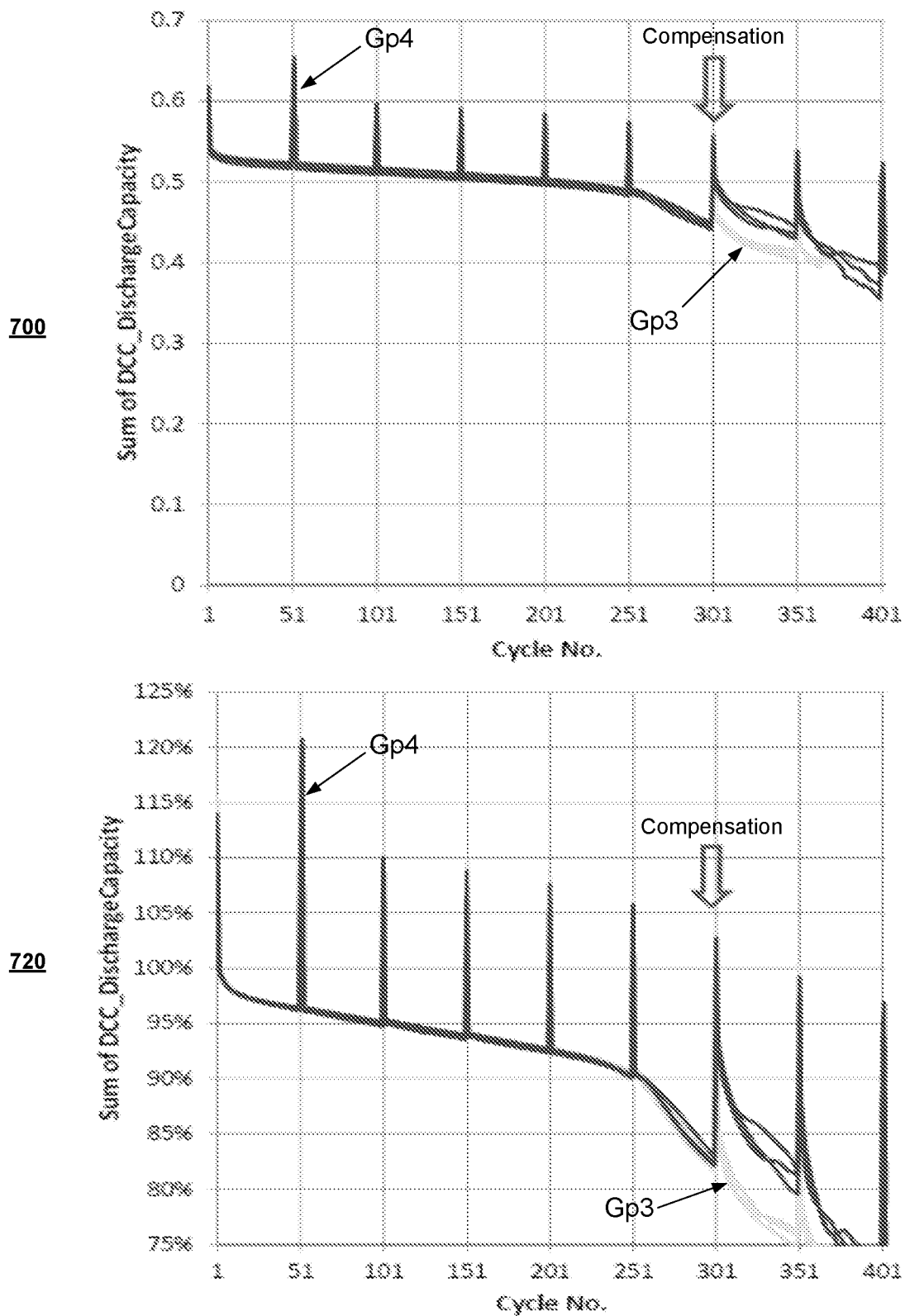
FIG. 7 illustrates discharge capacity characteristics for different groups of cells with 4.1V to 3.15V cycle life, including one group with compensation.

FIG. 7 illustrates discharge capacity characteristics for different groups of cells with 4.1V to 3.15V cycle life, including one group with compensation. Shown in FIG. 7 are charts 700 and 720, which illustrate discharge capacity profiles for three different groups of cells: Group 3 and Group 4.

In this regard, these groups comprise similar cells but are tested under different test conditions. In particular, the discharge capacity for each of these groups is measured under 4 C charge to 4.1V and 0.5 C discharge to 3.15V—that is, 4 C (4.1V)/0.5 C cycles. However, while testing of Group 3 is limited to use of 4.1V to 3.15V cycles, for Group 4, while 4.1V to 3.15V cycles are used initially, after 301 cycles the cycle is adjusted to 4.1V to 3.09V. In other words, compensation is applied to Group 4 at cycle 301 by lowering the cutoff discharge voltage from 3.15V to 3.09V. As illustrated in charts 700 and 720 of FIG. 7, after applying the compensation, capacity of Group 4 increases with similar fading slope as Group 3, but with cycle life extended by ~50 cycles.

Figure 8:
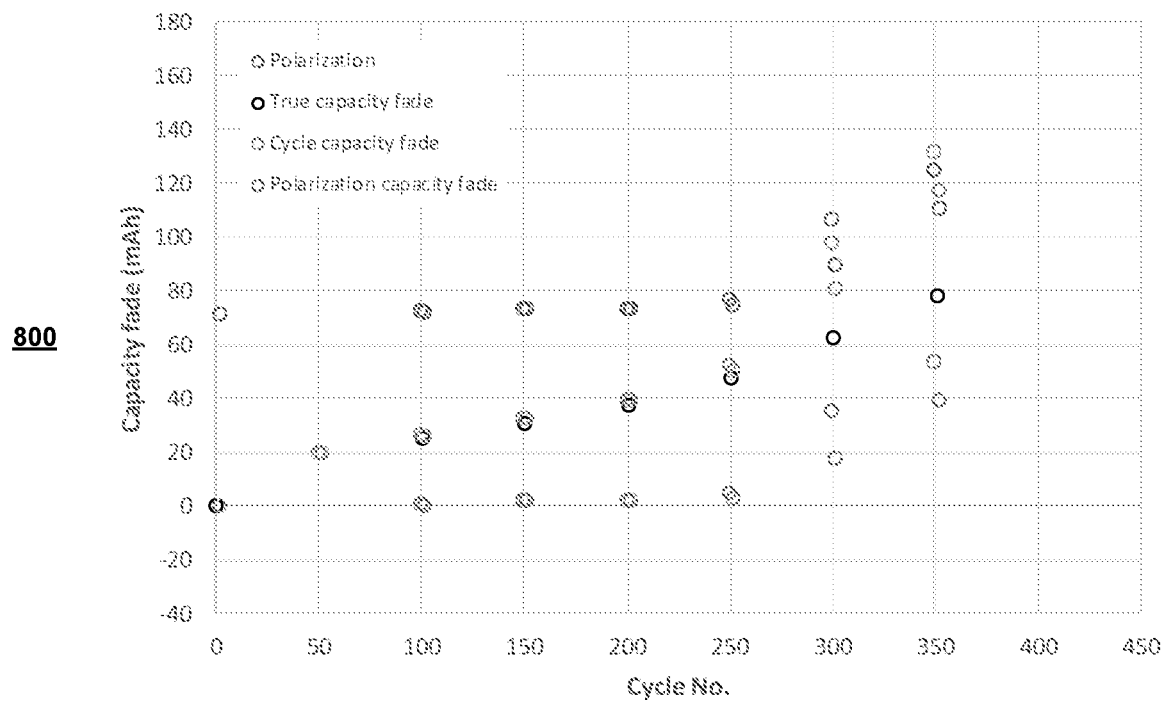
FIG. 8 illustrates capacity fade characteristics for example cells with 4.1V to 3.15V cycle life with and without compensation.
Figure 8:
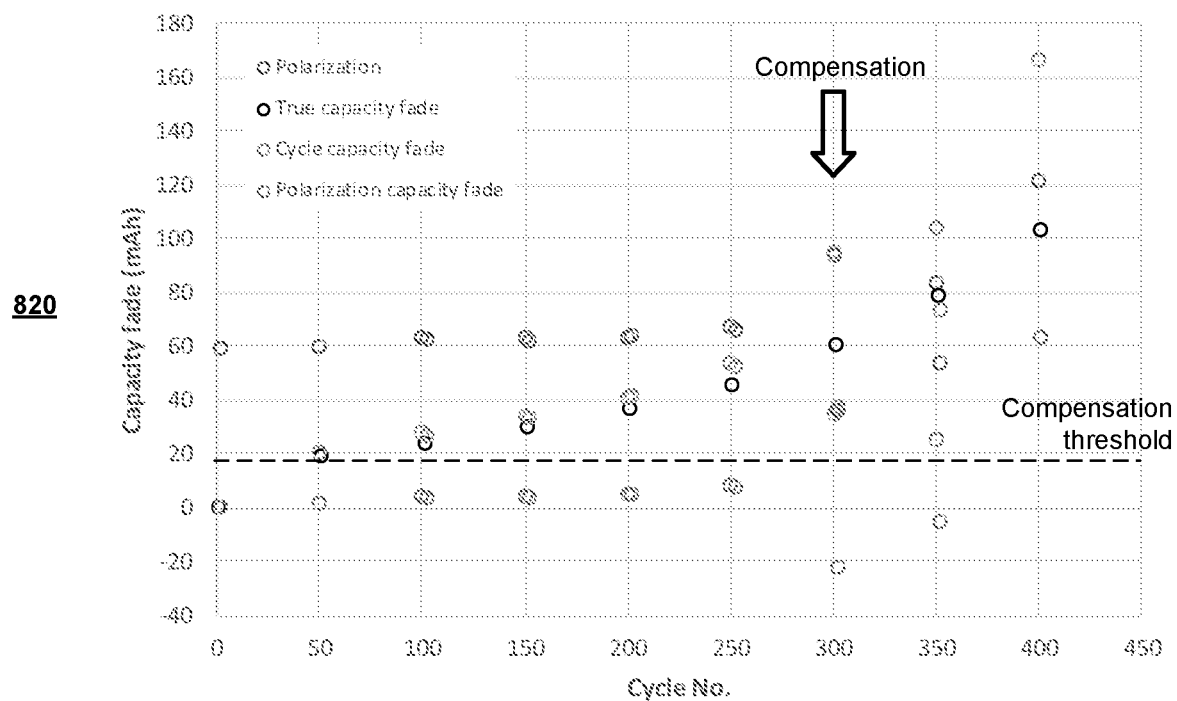

FIG. 8 illustrates capacity fade characteristics for example cells with 4.1V to 3.15V cycle life with and without compensation. Shown in FIG. 8 are charts 800 and 820, which illustrate capacity fade profile for cells used or tested under 4.1V to 3.15V cycle based conditions.

In particular, chart 800 shows capacity fade related parameters for cells used or tested under 4.1V to 3.15V cycle based conditions without any compensation, whereas chart 820 shows capacity fade related parameters for the same cells and the same cycle with compensation. In this regard, the capacity fade related parameters illustrated in FIG. 8 comprise true capacity fade, cycle capacity fade, polarization, and polarization capacity fade, as described with respect to FIG. 6.

As illustrated in charts 800 and 820, polarization capacity fade was positive from the beginning. Further, with 3.15V cutoff voltage and without compensation, polarization capacity fade increased earlier, whereas after compensation is applied, polarization capacity fade drops, and while it may continue to increase rapidly during later cycles, the life of the cells may be extended by a number of cycles (e.g., ~50 cycles). In this regard, as described with respect to FIG. 6, compensation may be applied when polarization capacity fade exceeds a particular compensation threshold (which may be pre-determined and/or pre-set).

An example method for managing operation of a silicon-dominant cell, in accordance with the present disclosure, comprises applying one or more adjustments to operation of the silicon-dominant cell based on effects of polarization in the silicon-dominant cell during charge/discharge cycles. The one or more adjustments are configured to compensate for at least some of the effects of polarization in the silicon-dominant cell.

In an example implementation, the one or more adjustments to operation of the silicon-dominant cell comprise adjusting cutoff points used during the charge/discharge cycles, and the method further comprises adjusting one or more cutoff points during at least one charge/discharge cycle.

In an example implementation, the method further comprises decreasing voltage cutoff point applicable to discharge of the silicon-dominant cell during the at least one charge/discharge cycle.

In an example implementation, the method further comprises increasing voltage cutoff point applicable to charging of the silicon-dominant cell during the at least one charge/discharge cycle.

In an example implementation, the method further comprises determining polarization related parameters, and determining at least one of the one or more adjustments based on the polarization related parameters.

In an example implementation, the method further comprises determining the polarization related parameters based on a state of health of the silicon-dominant cell.

In an example implementation, the method further comprises determining the state of health based on a self-assessment performed when the silicon-dominant cell is not being used.

In an example implementation, the method further comprises performing a pulse test on the silicon-dominant cell, and determining the state of health based on the pulse test.

In an example implementation, the method further comprises determining when to apply at least one of the one or more adjustments based on polarization capacity fade.

In an example implementation, the method further comprises applying the at least one of the one or more adjustments when the polarization capacity fade exceeds a preset threshold.

An example system, in accordance with the present disclosure, comprises a silicon-dominant cell and one or more circuits for managing operation of the silicon-dominant cell, with the one or more circuits configured to apply one or more adjustments to operation of the silicon-dominant cell based on effects of polarization in the silicon-dominant cell during charge/discharge cycles. The one or more adjustments are configured to compensate for at least some of the effects of polarization in the silicon-dominant cell.

In an example implementation, the one or more adjustments to operation of the silicon-dominant cell comprise adjusting cutoff points used during the charge/discharge cycles, and the one or more circuits are configured to adjust one or more cutoff points during at least one charge/discharge cycle.

In an example implementation, the one or more circuits are configured to decrease voltage cutoff point applicable to discharge of the silicon-dominant cell during the at least one charge/discharge cycle.

In an example implementation, the one or more circuits are configured to increase voltage cutoff point applicable to charging of the silicon-dominant cell during the at least one charge/discharge cycle.

In an example implementation, the one or more circuits are configured to determine polarization related parameters, and to determine at least one of the one or more adjustments based on the polarization related parameters.

In an example implementation, the one or more circuits are configured to determine the polarization related parameters based on a state of health of the silicon-dominant cell.

In an example implementation, the one or more circuits are configured to determine the state of health based on a self-assessment performed when the silicon-dominant cell is not being used.

In an example implementation, the one or more circuits are configured to perform a pulse test on the silicon-dominant cell, and to determine the state of health based on the pulse test.

In an example implementation, the one or more circuits are configured to determine when to apply at least one of the one or more adjustments based on polarization capacity fade.

In an example implementation, the one or more circuits are configured to apply the at least one of the one or more adjustments when the polarization capacity fade exceeds a preset threshold.

As utilized herein, "and/or" means any one or more of the items in the list joined by "and/or". As an example, "x and/or y" means any element of the three-element set {(x), (y), (x, y)}. In other words, "x and/or y" means "one or both of x and y." As another example, "x, y, and/or z" means any element of the seven-element set {(x), (y), (z), (x, y), (x, z), (y, z), (x, y, z)}. In other words, "x, y and/or z" means "one or more of x, y, and z." As utilized herein, the term "exemplary" means serving as a non-limiting example, instance, or illustration. As utilized herein, the terms "for example" and "e.g." set off lists of one or more non-limiting examples, instances, or illustrations.

As utilized herein the terms "circuits" and "circuitry" refer to physical electronic components (e.g., hardware), and any software and/or firmware ("code") that may configure the hardware, be executed by the hardware, and or otherwise be associated with the hardware. As used herein, for example, a particular processor and memory (e.g., a volatile or non-volatile memory device, a general computer-readable medium, etc.) may comprise a first "circuit" when executing a first one or more lines of code and may comprise a second "circuit" when executing a second one or more lines of code. Additionally, a circuit may comprise analog and/or digital circuitry. Such circuitry may, for example, operate on analog and/or digital signals. It should be understood that a circuit may be in a single device or chip, on a single motherboard, in a single chassis, in a plurality of enclosures at a single geographical location, in a plurality of enclosures distributed over a plurality of geographical locations, etc. Similarly, the term "module" may, for example, refer to a physical electronic components (e.g., hardware) and any software and/or firmware ("code") that may configure the hardware, be executed by the hardware, and or otherwise be associated with the hardware.

As utilized herein, circuitry or module is "operable" to perform a function whenever the circuitry or module comprises the necessary hardware and code (if any is necessary) to perform the function, regardless of whether performance of the function is disabled or not enabled (e.g., by a user-configurable setting, factory trim, etc.).

Other embodiments of the invention may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the processes as described herein.

Accordingly, various embodiments in accordance with the present invention may be realized in hardware, software, or a combination of hardware and software. The present invention may be realized in a centralized fashion in at least one computing system, or in a distributed fashion where different elements are spread across several interconnected computing systems. Any kind of computing system or other apparatus adapted for carrying out the methods described herein is suited. A typical combination of hardware and software may be a general-purpose computing system with a program or other code that, when being loaded and executed, controls the computing system such that it carries out the methods described herein. Another typical implementation may comprise an application specific integrated circuit or chip.

Various embodiments in accordance with the present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for managing operation of a silicon-dominant cell, the method comprising:
   assessing polarization in a silicon-dominant cell during charge/discharge cycles, wherein the polarization is assessed at least in part based on a difference between normal and slow rate discharge; and
   applying one or more adjustments to operation of the silicon-dominant cell based on effects of the polarization in the silicon-dominant cell during the charge/discharge cycles, wherein the one or more adjustments are configured to compensate for at least some of the effects of polarization in the silicon-dominant cell.

2. The method of claim 1, wherein the one or more adjustments to operation of the silicon-dominant cell comprise adjusting cutoff points used during the charge/discharge cycles, and further comprising adjusting one or more cutoff points during at least one charge/discharge cycle.

3. The method of claim 2, further comprising decreasing voltage cutoff point applicable to discharge of the silicon-dominant cell during the at least one charge/discharge cycle.

4. The method of claim 2, further comprising increasing voltage cutoff point applicable to charging of the silicon-dominant cell during the at least one charge/discharge cycle.

5. The method of claim 1, further comprising determining at least one of the one or more adjustments based on a state of health of the silicon-dominant cell.

6. The method of claim 5, further comprising determining the state of health based on a self-assessment performed when the silicon-dominant cell is not being used.

7. The method of claim 5, further comprising performing a pulse test on the silicon-dominant cell, and determining the state of health based on the pulse test.

8. The method of claim 1, further comprising determining when to apply at least one of the one or more adjustments based on polarization capacity fade.

9. The method of claim 8, further comprising applying the at least one of the one or more adjustments when the polarization capacity fade exceeds a preset threshold.

10. A system comprising:
    a silicon-dominant cell; and
    one or more circuits for managing operation of the silicon-dominant cell, wherein the one or more circuits are configured to:
       assess polarization in a silicon-dominant cell during charge/discharge cycles, wherein the polarization is assessed at least in part based on a difference between normal and slow rate discharge; and
       apply one or more adjustments to operation of the silicon-dominant cell based on effects of the polarization in the silicon-dominant cell during the charge/discharge cycles, wherein the one or more adjustments are configured to compensate for at least some of the effects of polarization in the silicon-dominant cell.

11. The system of claim 10, wherein the one or more adjustments to operation of the silicon-dominant cell comprise adjusting cutoff points used during the charge/discharge cycles, and wherein the one or more circuits are configured to adjust one or more cutoff points during at least one charge/discharge cycle.

12. The system of claim 11, wherein the one or more circuits are configured to decrease voltage cutoff point applicable to discharge of the silicon-dominant cell during the at least one charge/discharge cycle.

13. The system of claim 11, wherein the one or more circuits are configured to increase voltage cutoff point applicable to charging of the silicon-dominant cell during the at least one charge/discharge cycle.

14. The system of claim 10, wherein the one or more circuits are configured to determine at least one of the one or more adjustments based on a state of health of the silicon-dominant cell.

15. The system of claim 14, wherein the one or more circuits are configured to determine the state of health based on a self-assessment performed when the silicon-dominant cell is not being used.

16. The system of claim 14, wherein the one or more circuits are configured to perform a pulse test on the silicon-dominant cell, and to determine the state of health based on the pulse test.

17. The system of claim 10, wherein the one or more circuits are configured to determine when to apply at least one of the one or more adjustments based on polarization capacity fade.

18. The system of claim 17, wherein the one or more circuits are configured to apply the at least one of the one or more adjustments when the polarization capacity fade exceeds a preset threshold.

* * * * *